(12) United States Patent
Anemikos et al.

(10) Patent No.: US 8,239,811 B2
(45) Date of Patent: Aug. 7, 2012

(54) SYSTEM AND METHOD FOR WIRELESS AND DYNAMIC INTRA-PROCESS MEASUREMENT OF INTEGRATED CIRCUIT PARAMETERS

(75) Inventors: Theodoros E. Anemikos, Milton, VT (US); Phillip L. Corson, Westford, VT (US); Mete Erturk, St. Albans, VT (US); Ezra D. B. Hall, Richmond, VT (US); Anthony J. Perri, Jericho, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 1077 days.

(21) Appl. No.: 12/053,705

(22) Filed: Mar. 24, 2008

(65) Prior Publication Data

US 2009/0240452 A1 Sep. 24, 2009

(51) Int. Cl.
*G06F 17/50* (2006.01)
*G06F 11/22* (2006.01)

(52) U.S. Cl. ........................ 716/134; 716/136
(58) Field of Classification Search .................. 716/136, 716/134
See application file for complete search history.

(56) References Cited

U.S. PATENT DOCUMENTS

| | | | |
|---|---|---|---|
| 5,367,468 A | 11/1994 | Fukasawa et al. | |
| 6,182,510 B1 | 2/2001 | Stanke et al. | |
| 6,686,755 B2 * | 2/2004 | White et al. | 324/754.31 |
| 6,768,312 B2 * | 7/2004 | Sun et al. | 324/525 |
| 6,829,559 B2 * | 12/2004 | Bultman et al. | 702/155 |
| 6,913,938 B2 | 7/2005 | Shanmugasundram et al. | |
| 6,961,626 B1 | 11/2005 | Paik | |
| 7,220,990 B2 * | 5/2007 | Aghababazadeh et al. | 257/48 |
| 2003/0042915 A1 | 3/2003 | Kong et al. | |
| 2006/0234398 A1 | 10/2006 | Gluschenkov et al. | |
| 2007/0224712 A1 | 9/2007 | Kaushal et al. | |

OTHER PUBLICATIONS

Anemikos et al., U.S. Appl. No. 12/343,686, Office Action Communication, Apr. 15, 2011, 8 pages.
Anemikos et al., U.S. Appl. No. 12/343,686, Notice of Allowance, Sep. 12, 2011, 8 pages.

* cited by examiner

*Primary Examiner* — Vuthe Siek
*Assistant Examiner* — Mohammed Alam
(74) *Attorney, Agent, or Firm* — Gibb & Riley, LLC; Michael J. LeStrange, Esq.

(57) ABSTRACT

Disclosed are embodiments of a system and a method that allow for wireless and dynamic intra-process (i.e., during and/or between process steps) measurements of integrated circuit parameters. The embodiments incorporate the use of a passive circuit, such as an inductor-capacitor-resistor (LCR) circuit resonator, that has a predetermined sensitivity to process variations in one or more physical or electrical integrated circuit parameters. The passive circuit can be wirelessly interrogated between and/or process steps. Then, the actual behavior exhibited by the passive circuit in response to the interrogation is compared to the expected behavior of an optimal circuit in the absence of process variations in order to determine the one or more parameters. Also disclosed is an embodiment of an exemplary passive circuit that can be used to implement the disclosed system and method embodiments.

20 Claims, 11 Drawing Sheets

SYSTEM AND METHOD FOR WIRELESS AND DYNAMIC INTRA-PROCESS MEASUREMENT OF INTEGRATED CIRCUIT PARAMETERS

BACKGROUND

1. Field of the Invention

The embodiments of the invention generally relate to intra-process measurements of integrated circuit parameters and, more particularly, to a system and a method that allow for wireless and dynamic intra-process measurements of integrated circuit parameters.

2. Description of the Related Art

As lithographic geometries are reduced for each successive semiconductor process generation, the effects of process variability have become significant first order issues. Designers are faced with creating tradeoffs between timing margin, power, and performance. Tighter process controls would enable lower power, higher performance, and/or higher yielding products. The ability to control processes to tighter tolerances is limited by an inability to obtain actual inline (i.e., intra-process) integrated circuit parameter measurements for a given wafer or die or for a given site on a given wafer or die.

Current techniques for taking integrated circuit parameter measurements utilize wired mechanical probing systems. For example, a standard probe with multiple pads (e.g., 25 pads) is used to probe a given kerf having a multitude of corresponding pad sets (e.g., 25 pad sets), according the number of macros that are available for measurements. The number of sites sampled per wafer lot is typically minimized due to the time and expense associated with such mechanical probing, the available capacity at the probing stations, and the invariable mechanical damage imparted on probed sites. These kerf measurements are used for wafer disposition and for both feedforward and feedback control loops to adjust manufacturing variables for control of such parameters.

Unfortunately, the limited frequency and number of sites sampled limits the tightness of control through such historical methods. Additionally, in-situ measurement during actual wafer processing is prevented, thereby eliminating the possibility of live process adjustment and/or end point detection based on direct on wafer parametric measurement. Therefore, there is a need in the art for a system and a method that allow for wireless and dynamic intra-process (i.e., during and/or between process steps) measurements of integrated circuit parameters.

SUMMARY

In view of the foregoing, disclosed herein are embodiments of a system and a method that allow for wireless and dynamic intra-process (i.e., during and/or between process steps) measurements of integrated circuit parameters. The embodiments incorporate the use of a passive circuit, such as an inductor-capacitor-resistor (LCR) circuit resonator, that has a predetermined sensitivity to process variations in one or more physical or electrical integrated circuit parameters. The passive circuit can be wirelessly interrogated between and/or during process steps. Then, the actual behavior exhibited by the passive circuit in response to the interrogation is compared to the expected behavior of an optimal circuit in the absence of process variations in order to determine values for the one or more parameters. Also disclosed is an embodiment of an exemplary passive circuit that can be used to implement the disclosed system and method embodiments.

More particularly, disclosed herein are embodiments of a system for wireless measurement of integrated circuit parameters. Generally, the system embodiments comprise a stimulus source, a wireless-interrogation unit, a sensor, an analyzer and a wafer from which the measurements are to be taken. The wafer comprises a passive circuit with a predetermined sensitivity to process variations in one or more integrated circuit parameters (e.g., in one or more physical and/or electrical integrated circuit parameters). The passive circuit can further be adapted to exhibit, in response to a given stimulus, a given type of circuit behavior that can be wireless detected. The interrogation unit can be adapted to wirelessly detect this given type of circuit behavior. Specifically, the interrogation unit can be placed adjacent to the wafer such the passive circuit and interrogation unit are in close proximity, but physically separated. For example, a space that has a predetermined height and is filled with either air or a dielectric material can separate the passive circuit from the interrogation unit. Additionally, the passive circuit and interrogation unit can be uniquely configured so as to allow wireless communication or coupling for circuit behavior detection.

Both the stimulus source and the sensor can be electrically connected to or otherwise in communication with the interrogation unit. The stimulus source can be adapted to generate and apply a given stimulus to the passive circuit through the interrogation unit. The sensor can be adapted to sense and measure the actual behavior exhibited by the passive circuit in response to the stimulus. The analyzer can be in communication with the sensor and can be adapted to determine values for the one or more integrated circuit parameters based on the difference between the expected behavior and the actual behavior exhibited by the passive circuit in response to the stimulus. In making this determination, the analyzer can first normalize the measured data to account for of scaling, offset and noise errors, due to interrogation unit placement and distance from the passive circuit.

As described above, the general system embodiments comprise only one passive circuit. However, it is anticipated that the system will ideally comprise multiple passive circuits to be interrogated by the same or different interrogation units at the same time in order to more accurately determine the integrated circuit parameters. For example, the system can further comprise an additional interrogation unit similarly adapted to wirelessly detect the given type of circuit behavior. The wafer can further comprise an additional passive circuit similarly adapted to exhibit the given type of circuit behavior in response to the stimulus, but with a different predetermined sensitivity to the process variations in the one or more integrated circuit parameters. Finally, the analyzer can further be adapted to more accurately determine the value(s) of the one or more integrated circuit parameters based, not only on the actual behavior exhibited by the first passive circuit (as detected by the first interrogation unit), but also on the difference between the expected behavior and the actual behavior exhibited by the additional passive circuit in response to the stimulus (as detected by the additional interrogation unit).

Alternatively, the wafer can further contain an additional passive circuit similarly adapted to exhibit the given type of circuit behavior in response to the stimulus and with the same predetermined sensitivity to the process variations in the one or more integrated circuit parameters. However, in this case the additional passive circuit can be tuned differently than the passive circuit so that the interrogation unit can simultaneously interrogate the passive circuit and the additional passive circuit and so that the analyzer can more accurately determine the value(s) for the one or more integrated circuit parameters based, not only on the actual behavior exhibited by the first passive circuit (as detected by the first interrogation unit), but also on the difference between the expected behavior and the actual behavior exhibited by the additional passive circuit in response to the stimulus (as detected by the same interrogation unit).

An exemplary passive circuit, which can be incorporated into the system of the present invention, comprises a passive resonator. This passive resonator can comprise a substrate and, on the substrate, at least one structure with resistive behavior (e.g., a resistor), at least one structure with capacitive behavior (e.g., a capacitor) and at least one structure with inductive behavior (e.g., an inductor) that are all interconnected and configured to form an inductor-capacitor-resistor (LCR) circuit. Specifically, the resistor, capacitor and inductor of the LCR circuit can be interconnected and configured so that the LCR circuit exhibits, in response to an applied stimulus (e.g., radio frequency energy), resonant behavior that varies in a predictable manner as a function of the process variations in one or more targeted integrated circuit parameters. These targeted integrated circuit parameters can, for example, comprise physical and/or electrical integrated circuit parameters, such as, polysilicon sheet resistance, metal sheet resistance and/or contact height).

This LCR circuit can comprise a three-layer structure comprising a dielectric layer between a polysilicon resistor layer and a metal inductor layer such that the polysilicon resistor layer, the dielectric layer and the metal inductor layer in combination form the capacitor. The polysilicon resistor layer can comprise a polysilicon structure with a first center section and a plurality of second sections extending radially from the center section. The metal inductor layer can comprise a spiral-shaped metal wire with an inner end and an outer end. The polysilicon structure (i.e., the resistor) and the spiral-shaped metal wire (i.e., the inductor) can be aligned vertically. A contact extending vertically through the dielectric layer can electrically connect the resistor and the inductor and, more particularly, can electrically connect the center section of the resistor with the inner end of the inductor. Variations in the inductor, resistor and capacitor structures will alter the LCR circuit's sensitivity to specific process variations in the targeted integrated circuit parameters.

An embodiment of the system of the present invention that incorporates the above-described passive resonator or a similar passive resonator structure similarly comprises a stimulus source, a wireless-interrogation unit, a sensor, an analyzer and a wafer from which the measurements are to be taken. The wafer particularly comprises a passive resonator with a predetermined sensitivity to process variations in one or more of the above-mentioned targeted integrated circuit parameters. This passive resonator is adapted to exhibit resonant behavior in response to a stimulus, such as radio frequency energy in the form of a radio frequency pulse or sine voltage.

The interrogation unit can be adapted to wirelessly detect this resonant behavior. For example, the interrogation unit can comprise a wire coil with an input node adapted to receive a stimulus (e.g., to receive radio frequency energy in the form of a radio frequency pulse or sine voltage) at one end. The wire coil can further comprise an output node at the opposite end. Thus, during interrogation, the radio frequency signal is transmitted through the coil between the input node and output node. Additionally, during interrogation, the wire coil is place in close proximity to the passive resonator such that it is inductively coupled to the passive resonator without physically contacting it. For example, a space that has a predetermined height and is filled with either air or a dielectric material can separate the passive resonator from the wire coil interrogation unit.

The stimulus source can be electrically connected to the input node of the interrogation unit and the sensor can be electrically connected the output node of the interrogation unit. The stimulus source can be adapted to generate and apply a given stimulus (e.g., radio frequency energy) to the input node. For example, the stimulus source can comprise a pulse generator adapted to generate and apply a radio frequency pulse to the input node of the interrogation unit. Alternatively, the stimulus source can comprise a sine sweep generator adapted to generate and apply a sine voltage to the input node of the interrogation unit. As mentioned above, during interrogation, the interrogator unit and resonator are inductively coupled such that the resonant behavior of the resonator in response to the applied radio frequency will impact the signal at the output node.

The sensor can be adapted to sense and measure the actual behavior exhibited by the passive resonator in response to the stimulus (as detected by the interrogation unit). Specifically, if a pulse generator is used, the sensor can comprise a spectrum analyzer electrically connected between the output node of the interrogation unit and the analyzer. This spectrum analyzer can be adapted to sense and measure the actual response of the resonator at the output node, to generate a frequency spectrum based on the actual response and to communicate the frequency spectrum (phase and amplitude vs. frequency) to the analyzer. If a sine sweep generator is used, the sensor can similarly comprise a spectrum analyzer electrically connected between the output node of the interrogation unit and the analyzer and adapted to sense and measure the actual response of the resonator at the output node. However, the spectrum analyzer can be adapted to generate an amplitude spectrum, and a phase spectrum based on the actual response and to communicate both spectrums to the analyzer.

The analyzer can be adapted to determine the value(s) of the one or more integrated circuit parameters based on the difference between the expected behavior (i.e., the optimal circuit behavior in the absence of process variations) and the actual behavior exhibited by the passive resonator in response to the radio frequency energy and depicted in the frequency, phase and/or amplitude spectrums. Again, in making this determination, the analyzer can first normalize the measured data to account for of scaling, offset and noise errors, due to placement of the interrogation unit and distance from the resonator.

Also disclosed are embodiments of an associated method for wireless measurement of integrated circuit parameters. The method embodiments comprise designing a passive circuit that exhibits, in response to a given stimulus, a give type of behavior capable of being wirelessly detected and that further has a predetermined sensitivity to process variations in one or more integrated circuit parameters (e.g., one or more physical or electrical integrated circuit parameters). For example, the passive circuit can be designed as a passive resonator, as described above, that exhibits resonant behavior in response to radio frequency energy (e.g., a radio frequency pulse or sine voltage) and that has a predetermined sensitivity to process variations in one or more integrated circuit parameters (e.g., polysilicon sheet resistance, metal sheet resistance or contact height). Following design, the passive circuit is simulated and, more specifically, the simulations are performed to predict not only circuit behavior in the absence of process variations and but also in the presence of different process variations. Then, the passive circuit is formed on a wafer.

During wafer processing (i.e., during and/or between process steps), this passive circuit can be wirelessly interrogated to determine the actual behavior exhibited by the passive circuit in response to an applied stimulus. Then, the actual behavior data is normalized to account for scaling, offset and/or noise errors and value(s) for the one or more integrated circuit parameters are determined based on a difference between the expected behavior (i.e., the optimal circuit behavior in the absence of process variations) and the actual behavior exhibited by the circuit. The results of this determining process (i.e., integrated circuit parameter measurements) can then be used in feedforward and/or feedback control loops as well as in in-situ control, end point detection and hardware disposition.

As described above, the method embodiments comprise interrogating only one passive circuit on a wafer. However, it is anticipated that the method will ideally comprise simultaneously interrogating multiple passive resonators in order to more accurately determine the integrated circuit parameters. For example, the wafer can comprise an additional passive circuit with a different predetermined sensitivity to the process variations in the at least one integrated circuit parameter. The additional passive circuit can be wirelessly interrogated, e.g., by a different interrogation unit, to detect the actual behavior exhibited by the additional passive circuit in response to the stimulus. The determining process can then be more accurate in that it is based, not only on the actual behavior exhibited by the first passive circuit (as detected by the first interrogation unit), but also on the difference between the expected behavior and the actual behavior exhibited by the additional passive circuit in response to the stimulus (as detected by the additional interrogation unit).

Alternatively, the wafer can comprise an additional passive circuit with the same predetermined sensitivity to the process variations in the at least one integrated circuit parameter, but tuned differently than the passive circuit. Then, while the first passive circuit is being interrogated, this additional passive circuit can also be interrogated (i.e., essentially simultaneously) by the same interrogation unit. The determining process can then be more accurate in that it is based, not only on the actual behavior exhibited by the first passive circuit (as detected by the interrogation unit), but also on the difference between the expected behavior and the actual behavior exhibited by the additional passive circuit in response to the stimulus (also as detected by the same interrogation unit).

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of these embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
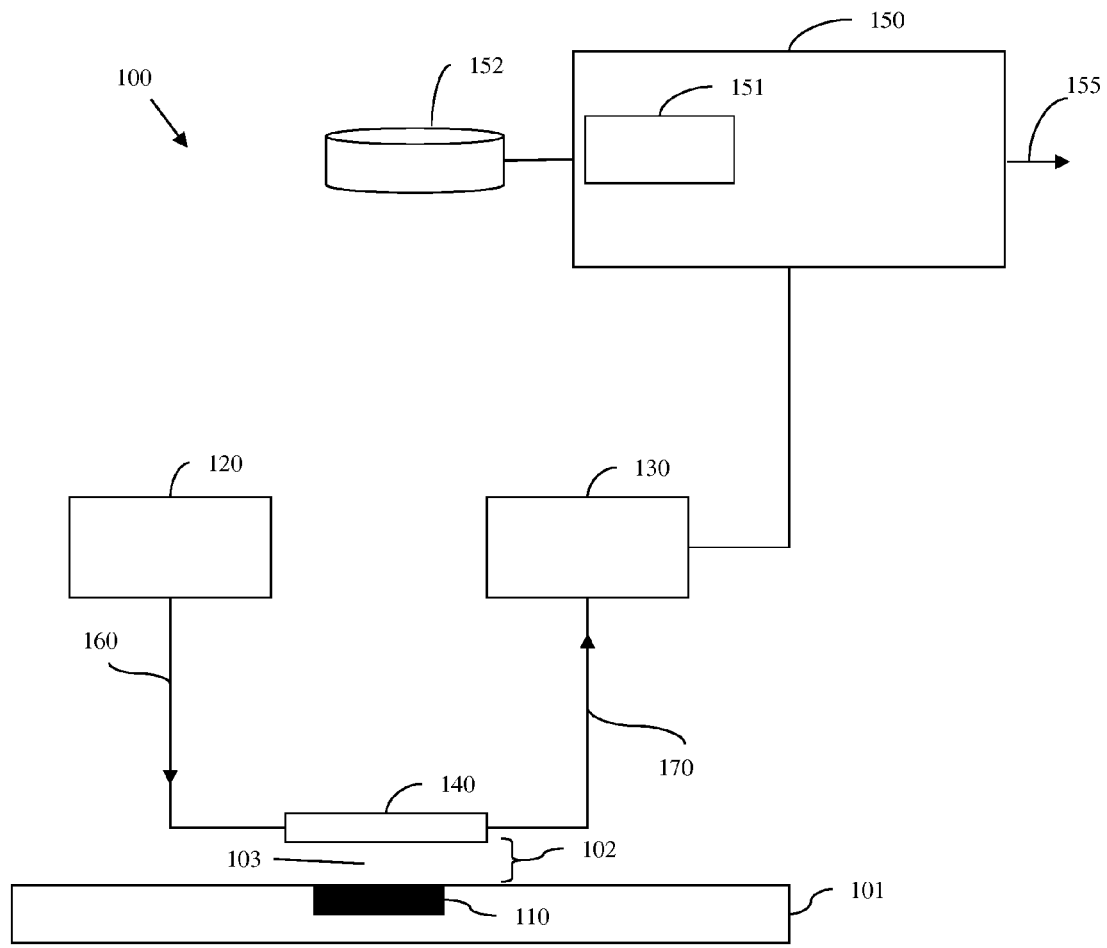
FIG. 1 is a block diagram illustrating a general embodiment of the system of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, there is a need in the art for a system and a method that allow for wireless and dynamic intra-process (i.e., during and/or between process steps) measurements of integrated circuit parameters. In view of the foregoing, disclosed herein are embodiments of a system and a method that allow for wireless and dynamic intra-process measurements of integrated circuit parameters. The embodiments incorporate the use of a passive circuit, such as an inductor-capacitor-resistor (LCR) circuit resonator, that has a predetermined sensitivity to process variations in one or more physical or electrical integrated circuit parameters. The passive circuit can be wirelessly interrogated between and/or during process steps. Then, the actual behavior exhibited by the passive circuit in response to the interrogation is compared to the expected behavior of an optimal circuit in the absence of process variations in order to determine the value(s) of one or more parameters. Also disclosed is an embodiment of an exemplary passive circuit that can be used to implement the disclosed system and method embodiments.

More particularly, referring to FIG. 1, disclosed herein are embodiments of a system 100 for wireless measurement of integrated circuit parameters. Generally, the system 100 embodiments comprise a stimulus source 120, a wireless-interrogation unit 140, a sensor 130, an analyzer 150 and a wafer 101 from which the integrated circuit parameter measurements are to be taken. The wafer 101 comprises a passive circuit 110 with a predetermined sensitivity to process variations in one or more integrated circuit parameters.

These integrated circuit parameters can comprise one or more physical and/or electrical integrated circuit parameters, such as metal dimensions, via or contact dimensions, polysilicon structure dimensions, sheet resistances, etc. The passive circuit 110 can further be adapted to exhibit, in response to a given stimulus 160, a given type of circuit behavior 170 that can be wireless detected. Specifically, the passive circuit 110 can be formed from one or more of the wafer layers (e.g., the semiconductor substrate, polysilicon layer, metal layers, dielectric layers, etc.) and can comprise, for example, an inductor-capacitor-resistor (LCR) circuit, a transmission line, or any other variety of passive circuit (or passive-active circuit combination) capable of being wireless interrogated. The predetermined sensitivity to process variations in the one or more integrated circuit parameters is demonstrated by variations in the exhibited circuit behavior 170, in response to the applied stimulus 160. That is, a variation in a given physical or electrical parameter over what is optimal will result in a corresponding variation in the wirelessly detectable circuit behavior, when the stimulus 160 is applied to the circuit 110.

Figure 2:
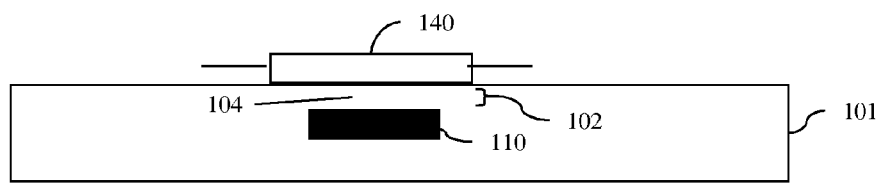
FIG. 2 is a block diagram illustrating an alternative configuration for the system of FIG. 1.

The interrogation unit 140 can be adapted to wirelessly detect this given type of circuit behavior. Specifically, the interrogation unit 140 can be placed adjacent to the wafer 101 such the passive circuit 110 and interrogation unit 140 are in close proximity, but physically separated. For example, a space 102 that has a predetermined height and is filled with either air 103 (as illustrated in FIG. 1) or a dielectric material 104 (as illustrated in FIG. 2) can physically separate the passive circuit 110 from the interrogation unit 140. Additionally, the passive circuit 110 and interrogation unit 140 can be uniquely configured so as to allow wireless communication or coupling for circuit behavior detection. For example, the passive circuit 110 and interrogation unit 140 can be inductively coupled.

Both the stimulus source 120 and the sensor 130 can be electrically connected to or otherwise in communication with the interrogation unit 140. The stimulus source 120 can be adapted to generate and apply a given stimulus 160 to the passive circuit 110 through the interrogation unit 140. The sensor 130 can be adapted to sense and measure the actual behavior 170 exhibited by the passive circuit 110 in response to the stimulus 160 (as detected by the interrogation unit 140). It should be understand that the stimulus source 120 and sensor 140 can comprise discrete transmit and receive units connected to the interrogation unit 140, as illustrated. Alternatively, the stimulus source 120 and sensor 140 can comprise a combined transmit-receive unit.

The analyzer 150 can be in communication with the sensor 130 and can be adapted to determine the value(s) for one or more integrated circuit parameters based on the difference between the expected behavior (i.e., the optimal circuit behavior in the absence of process variations) and the actual behavior 170 exhibited by the passive circuit 110 in response to the stimulus 121. In making this determination, the analyzer 150 can first normalize the measured data 170 (e.g., using a data normalizer 151) to account for scaling, offset and/or noise errors, which would prevent a direct correlation of parametric values to measurements. Such scaling, offset and noise errors can occur due to placement of the interrogation unit 140 and its distance from the passive circuit 110. Furthermore, the analyzer 150 can access a database 152 of simulation results that predict not only circuit 110 behavior in the absence of process variations and but also in the presence of different process variations. The output 155 of the analyzer (i.e., the intra-process integrated circuit parameter measurements) can be used to provide immediate control for parametric centering through in-process correction, for end point detection, for feedback corrections to prior process steps and/or for feedforward corrections to subsequent process steps.

Figure 3:
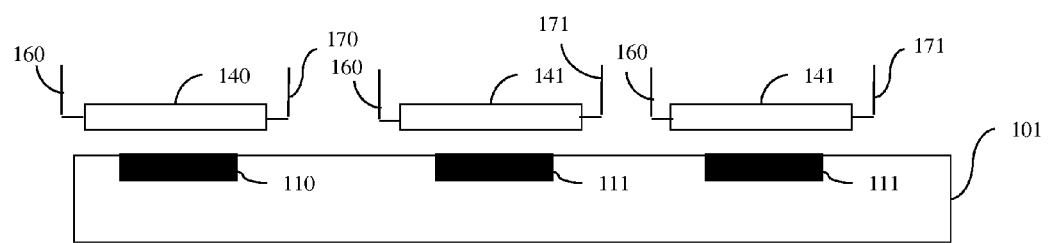
FIG. 3 is a block diagram illustrating another alternative configuration for the system of FIG. 1.

As described above, the general system 100 embodiments comprise only one passive circuit 110. However, it is anticipated that the system 100 will ideally comprise one or more additional passive circuits 111 to be interrogated by the same interrogation unit 140 or different interrogation units 141 at the same time in order to more accurately determine values of the integrated circuit parameters. For example, referring to FIG. 3 in combination with FIG. 1, the system 100 can further comprise one or more additional interrogation units 141 similarly adapted to wirelessly detect the given type of circuit behavior. The wafer 101 can further comprise one or more additional passive circuits 111 similarly adapted to exhibit the given type of circuit behavior in response to the stimulus 121, but with different predetermined sensitivities to the process variations in the one or more integrated circuit parameters. Finally, the analyzer 150 can further be adapted to more accurately determine the value(s) for the one or more integrated circuit parameters based, not only on the actual behavior 170 exhibited by the first passive circuit 110 (as detected by the first interrogation unit 140), but also on the difference between the expected behavior and the actual behavior 171 exhibited by the additional passive circuit(s) 111 in response to the stimulus 160 (as detected by the additional interrogation unit(s) 141).

Figure 4:
FIG. 4 is a block diagram illustrating yet another alternative configuration for the system of FIG. 1.

Alternatively, referring to FIG. 4 in combination with FIG. 1, the wafer 101 can further contain one or more additional passive circuit(s) 141 similarly adapted to exhibit the given type of circuit behavior in response to the stimulus 160 and with the same predetermined sensitivity to the process variations in the one or more integrated circuit parameter. However, in this case the additional passive circuit(s) 141 can be tuned differently than the passive circuit 110 so that the interrogation unit 140 can simultaneously interrogate the passive circuit 110 and the additional passive circuit(s) 111 and so that the analyzer 150 can more accurately determine the value (s) for the one or more integrated circuit parameters based, not only on the actual behavior 170 exhibited by the first passive circuit (as detected by the first interrogation unit), but also on the difference between the expected behavior and the actual behavior 170 exhibited by the additional passive circuit in response to the stimulus (as detected by the same interrogation unit 140). Because multiple passive circuits 110, 111 can be simultaneously interrogated, the present inline measuring technique provides higher sampling rates and tighter process controls over prior art inline measuring techniques.

Figure 5:
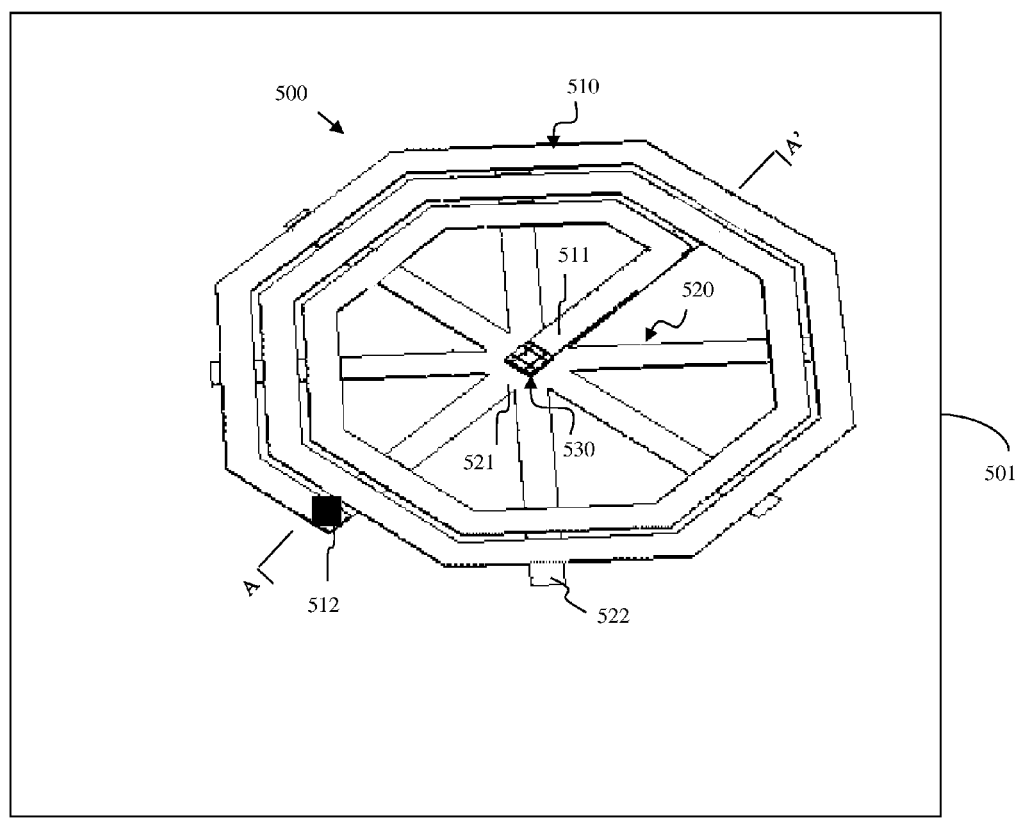
FIG. 5 is a diagram illustrating a top view of an exemplary passive resonator circuit that can be incorporated into the system and method embodiments of the present invention.
Figure 6:
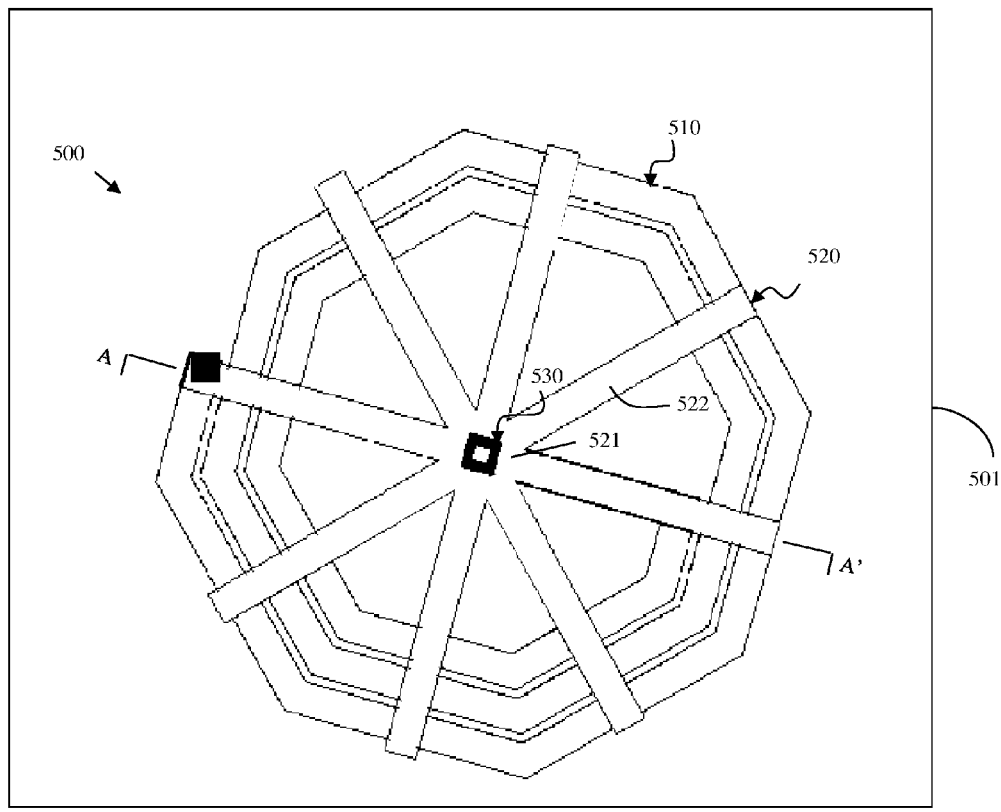
FIG. 6 is a diagram illustrating a bottom view of the exemplary passive resonator circuit of FIG. 3.
Figure 7:
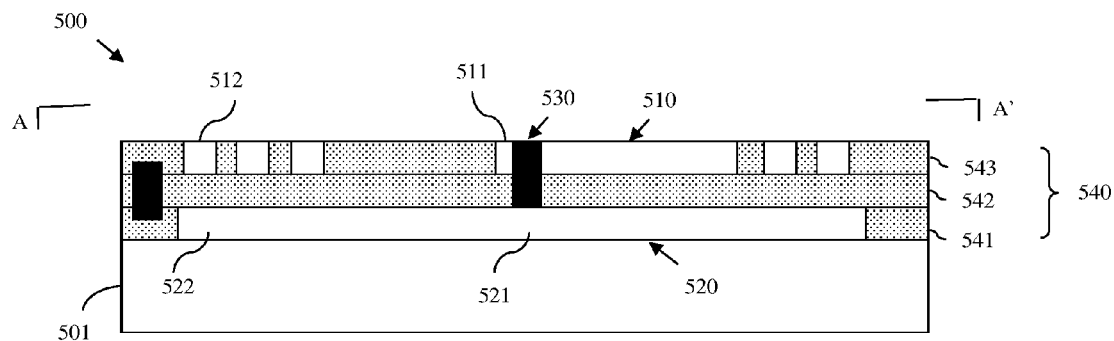
FIG. 7 is a diagram illustrating a cross-section view of the exemplary passive resonator circuit of FIG. 3.
Figure 8:
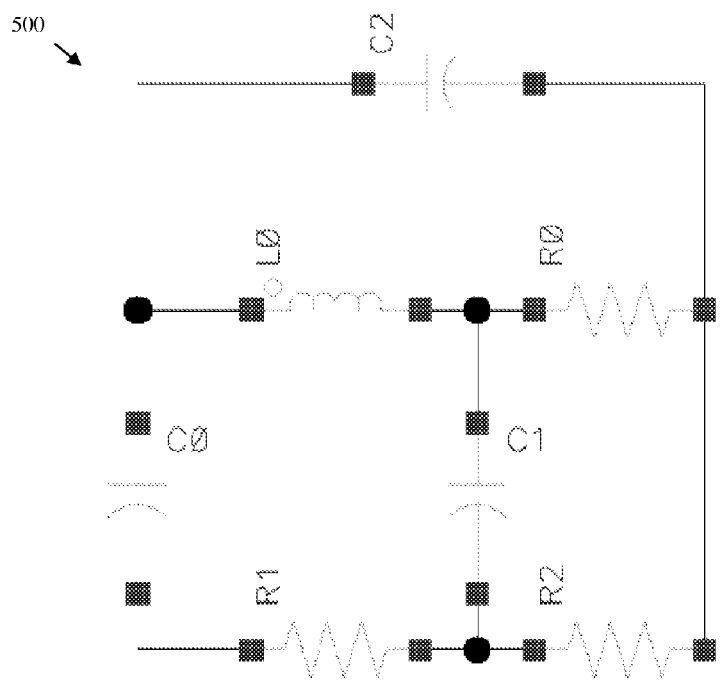
FIG. 8 is a schematic circuit diagram illustrating the exemplary passive resonator circuit of FIG. 3.

Also disclosed is an exemplary passive circuit and, more particularly, a passive resonator, which can be incorporated into the system 100 of the present invention as item 110. FIG. 5 is a top view diagram of this exemplary passive resonator circuit 500. FIG. 6 is a bottom view diagram of this exemplary passive resonator circuit 500. FIG. 7 is a cross-section view diagram of this exemplary passive resonator circuit 500. Finally, FIG. 8 is a schematic circuit diagram of the exemplary passive resonator circuit 500.

Referring to FIGS. 5-8 in combination, this passive resonator 500 can comprise a substrate 501 (e.g., a wafer) and, on the substrate 501, at least one structure with resistive behavior (e.g., resistor 520), at least one structure having capacitive behavior (e.g., a capacitor 540, see FIG. 7 and discussion below) and at least one structure having inductive behavior (e.g., an inductor 510) that are all interconnected and configured to form an inductor-capacitor-resistor (LCR) circuit. Specifically, the resistor 520, capacitor 540 and inductor 510 of the LCR circuit can be interconnected and configured so that the LCR circuit exhibits, in response to an applied stimulus (e.g., radio frequency energy), resonant behavior that varies in a predictable manner as a function of the process variations in one or more integrated circuit parameter (e.g., in one or more physical and/or electrical integrated circuit parameters).

For example, as illustrated particularly in FIG. 7, the LCR circuit can comprise a three-layer structure comprising a dielectric layer 542 between a polysilicon resistor layer 541 and a metal inductor layer 543 such that the polysilicon resistor layer 541, the dielectric layer 542 and the metal inductor layer 543 in combination form the capacitor 540. The polysilicon resistor layer 541 can comprise a polysilicon resistor structure 520 with a first center section 521 and a plurality of second sections 522 extending radially from the first center section 521. The metal inductor layer 543 can comprise a spiral-shaped metal wire (i.e., an inductor 510) with an inner end 511 and an outer end 512. The polysilicon structure (i.e., the resistor 520) and spiral-shaped metal wire (i.e., the inductor 520) can be aligned vertically. A contact 530 extending vertically through the dielectric layer 542 can electrically connect the resistor 520 and the inductor 520 and, more particularly, can electrically connect the center section 521 of the resistor 520 with the inner end 511 of the inductor 510.

Figure 9:
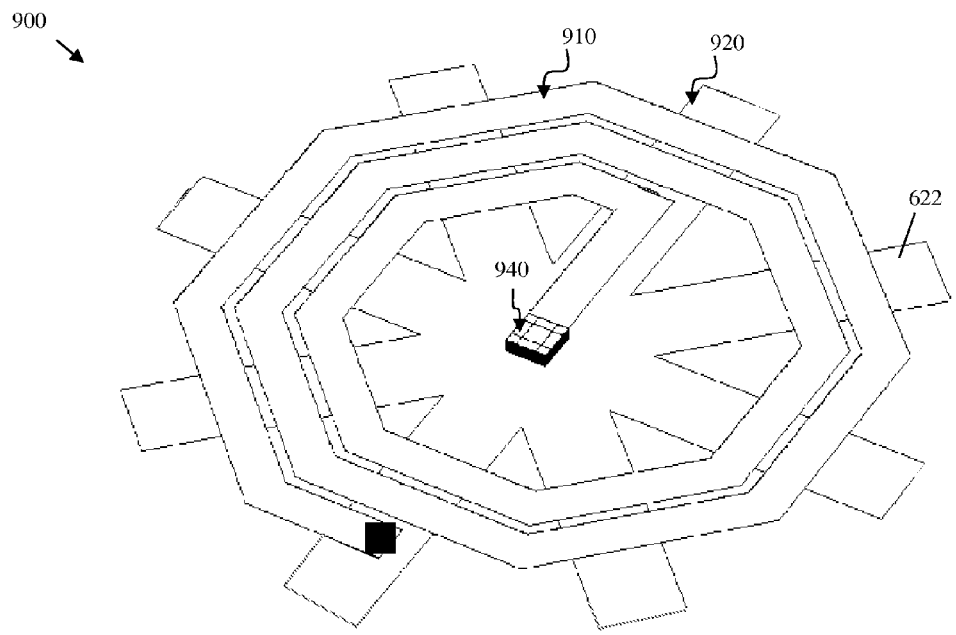
FIGS. 9-11 are diagrams illustrating similar passive resonator circuits with different process variation sensitivities.
Figure 10:
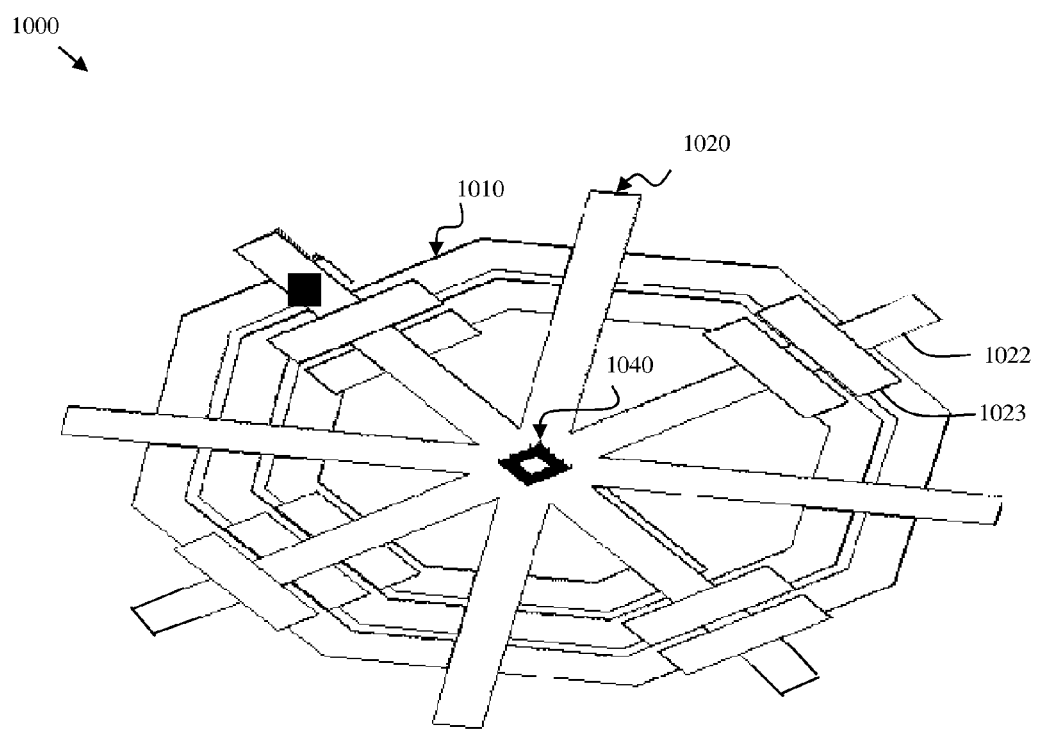
Figure 11:
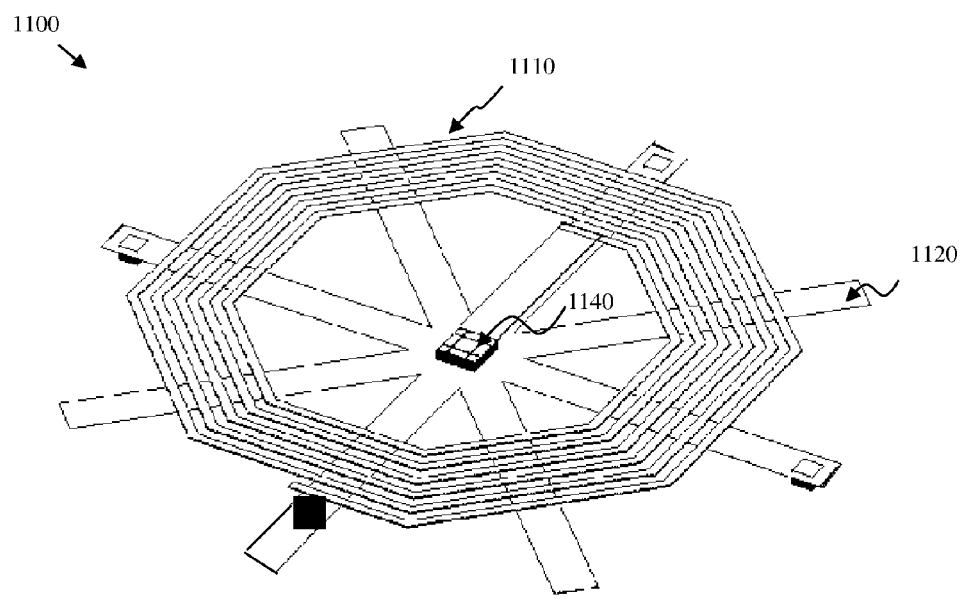

Furthermore, variations in the inductor 510, resistor 520 and capacitor 540 structures will alter the LCR circuit's sensitivity to specific process variations in the specific integrated circuit parameters, such as polysilicon sheet resistance, contact height and metal sheet resistance. For example, the passive resonator 500, as illustrated in FIGS. 5 and 7, may have a "default" sensitivity to metal sheet resistance in the metal layer 543 containing the inductor 510, to contact 530 height (i.e., to the thickness of the dielectric layer 542 creating the capacitor 540) and to polysilicon sheet resistance in the polysilicon layer 541 containing the resistor 520. However, as illustrated in FIG. 9, a similar resonator 900 can be formed with thicker sections 522. Thus, relative to the default sensitivities of the passive resonator 500 of FIG. 5, the passive resonator 900 of FIG. 9 will have decreased sensitivity to polysilicon sheet resistance, but increased sensitivity to contact 940 height, due to increased capacitance between the resistor 920 and inductor 910. As illustrated in FIG. 10, a similar resonator 1000 can be formed with additional polysilicon sections 1023 traversing the radial sections 1022 of the resistor 1020. Thus, relative to the default sensitivities of the passive resonator 500 of FIG. 5, the passive resonator 1000 of FIG. 10 will have increased sensitivity to contact 1040 height, due to the increased capacitance between the resistor 1020 and inductor 1010, but will maintain the default sensitivity to polysilicon sheet resistance. Finally, as illustrated in FIG. 11, a similar resonator 1100 can be formed with additional thinner spirals in the inductor 1110 coil. Thus, relative to the default sensitivities of the passive resonator 500 of FIG. 5, the passive resonator 1100 will have increased sensitivity to metal sheet resistance, but will maintain the same sensitivity to contact 1140 height (i.e., equivalent capacitance between the resistor 1120 and inductor 1110) and to polysilicon sheet resistance.

Figure 12:
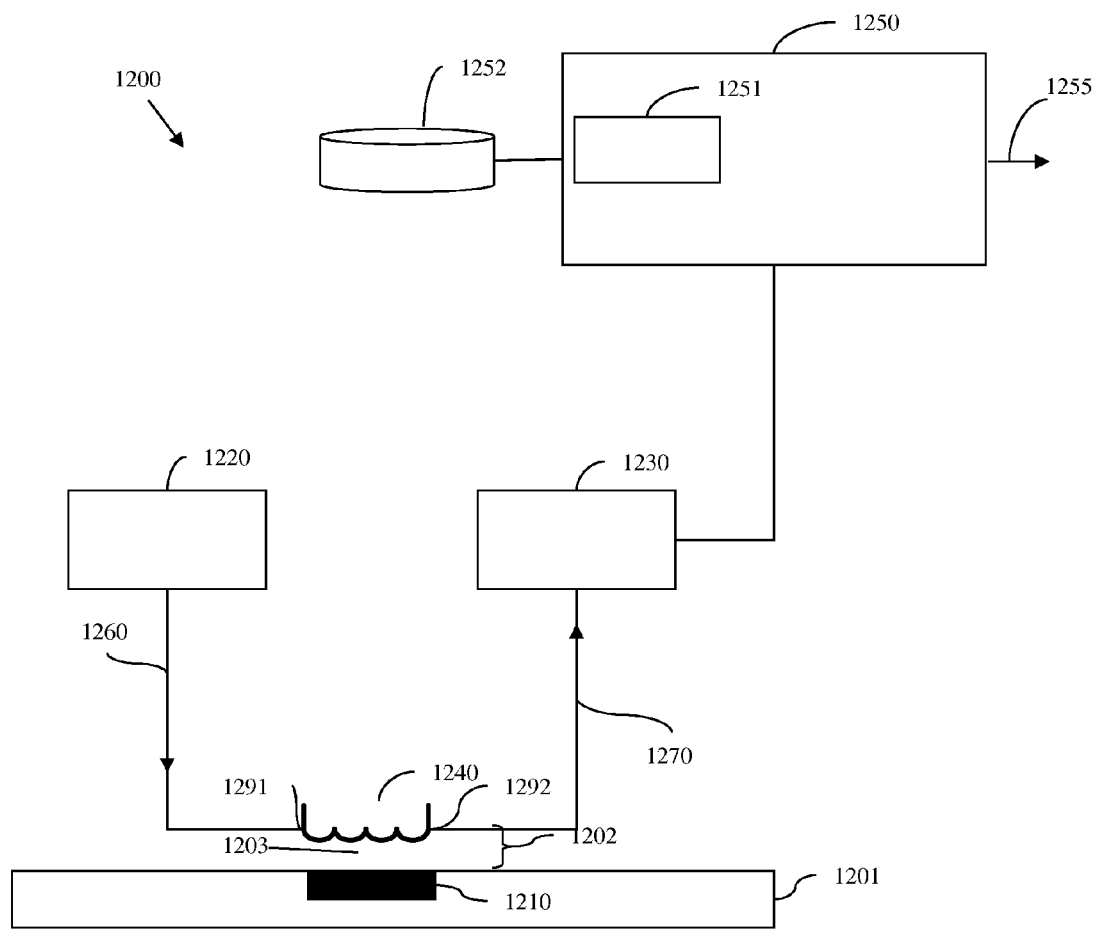
FIG. 12 is a block diagram illustrating a specific embodiment of the system of the invention incorporating a passive resonator such as that illustrated in FIGS. 5-8.

Thus, referring to FIG. 12, an embodiment of the system 1200 of the present invention that incorporates the above-described passive resonator 500 or a similar passive resonator structure is also disclosed. The system 1200 can similarly comprise a stimulus source 1220, a wireless-interrogation unit 1240, a sensor 1230, an analyzer 1250 and a wafer 1201 from which the measurements are to be taken. The wafer 120 particularly comprises a passive resonator 1210, such as the passive resonator 500 described above and illustrated in FIG. 5, with a predetermined sensitivity to process variations in one or more integrated circuit parameters (e.g., in one or more physical and/or electrical integrated circuit parameters, such as polysilicon sheet resistance, contact height and metal sheet resistance). This passive resonator 1210 is adapted to exhibit resonant behavior in response to a stimulus 1260, such as radio frequency energy in the form of a radio frequency pulse or sine voltage. The predetermined sensitivity to process variations in the one or more integrated circuit parameters is demonstrated by variations in resonant behavior exhibited by the passive resonator 1210, in response to applied radio frequency energy 1260. That is, a variation in a given physical or electrical parameter (e.g., polysilicon sheet resistance, contact height or metal sheet resistance) over what is optimal will result in a corresponding variation in the wirelessly detectable resonant behavior 1270, when radio frequency energy 1260 is applied to the resonator 1210.

Figure 13:
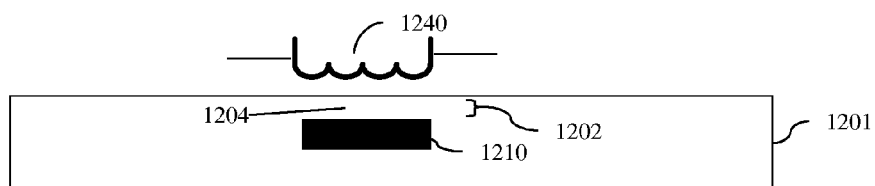
FIG. 13 is a block diagram illustrating an alternative configuration for the system of FIG. 12.

The interrogation unit 1240 can be adapted to wirelessly detect this resonant behavior. For example, the interrogation unit 1240 can comprise a wire coil with an input node 1291 adapted to receive a stimulus 1260 (e.g., to receive radio frequency energy in the form of a radio frequency pulse or sine voltage) at one end. The wire coil 1240 can further comprise an output node 1291 at the opposite end. Thus, during interrogation, the radio frequency signal 1260 is transmitted through the coil 1240 between the input node 1291 and output node 192. Additionally, during interrogation, the wire coil 1240 is place in close proximity to the passive resonator 1210 such that it is inductively coupled to the passive resonator 1210 without physically contacting it. For example, a space 1202 that has a predetermined height and is filled with either air 1203 (as illustrated in FIG. 12) or a dielectric material 1204 (as illustrated in FIG. 13) can separate the passive resonator 1210 from the wire coil interrogation unit 1240.

The stimulus source 1220 can be electrically connected to the input node 1291 of the interrogation unit 1240 and the sensor 1230 can be electrically connected the output node 1292 of the interrogation unit 1240. The stimulus source can be adapted to generate and apply a given stimulus 1260 (e.g., radio frequency energy) to the input node 1291. For example, the stimulus source 1220 can comprise a pulse generator adapted to generate and apply a radio frequency pulse to the input node 1291 of the interrogation unit. Alternatively, the stimulus source 1220 can comprise a sine sweep generator adapted to generate and apply a sine voltage to the input node 1291 of the interrogation unit. As mentioned above, during interrogation, the interrogator unit 1240 and resonator 1210 are inductively coupled such that the resonant behavior of the resonator 1210 in response to the applied radio frequency will impact the signal at the output node 1292.

The sensor 1230 can be adapted to sense and measure the actual behavior 1270 exhibited by the passive resonator in response to the stimulus 1260 (as detected by the interrogation unit). Specifically, if a pulse generator is used, the sensor 1230 can comprise a spectrum analyzer electrically connected between the output node 1292 of the interrogation unit 1240 and the analyzer 1250. This spectrum analyzer can be adapted to sense and measure the actual response of the resonator 1210 at the output node 1292, to generate a frequency spectrum (e.g., phase and amplitude vs. frequency) based on the actual response and to communicate the frequency spectrum to the analyzer 1250. If a sine sweep generator is used, the sensor 1230 can similarly comprise a spectrum analyzer electrically connected between the output node 1292 of the interrogation unit 1240 and the analyzer 1250 and adapted to sense and measure the actual response of the resonator 1210 at the output node 1292. However, the spectrum analyzer can be adapted to generate an amplitude spectrum and a phase spectrum based on the actual response and to communicate both spectrums to the analyzer 1250.

It should be understood that the stimulus source 1220 and sensor 1240 can comprise discrete transmit and receive units connected to the interrogation unit 1240, as illustrated. Alternatively, the stimulus source 1220 and sensor 1240 can comprise a combined transmit-receive unit for radio frequency signals.

The analyzer 1250 can be adapted to determine the value(s) for the one or more integrated circuit parameters based on the difference between the expected behavior (i.e., the optimal circuit behavior in the absence of process variations) and the actual behavior 1270 exhibited by the passive resonator 1210 in response to the radio frequency energy 1260 and depicted in the frequency, phase and/or amplitude spectrums. Specifically, the amplitude and phase response of the wire coil interrogation unit 1240 will be modified by the passive resonator 1210 and will vary according to targeted parametric variances. In this manner, the actual response curves for the behavior of the passive circuit 1210 itself can be extracted and used by the analyzer 1250 to determine the values for (i.e., effectively measure) the parameters of the integrated circuit.

Again, before determining the parameters, the analyzer 1250 must first normalize the measured data (e.g., using a data normalizer 1251) to account for scaling, offset and/or noise errors, which would prevent a direct correlation of parametric values to measurements. Such scaling, offset and noise errors can be due to placement of the wire coil interrogation unit 1240 and its distance from the resonator 1210. To ensure adequate normalization, the normalization can be performed against one or more reference frequencies and/or on a first order derivative of the measured data. That is, such measurement errors can be removed through application of the first order derivative of the data along with normalization. Normalization can further be combined with exploitation of targeted frequency ranges for targeted parametric sensitivities.

Figure 14:
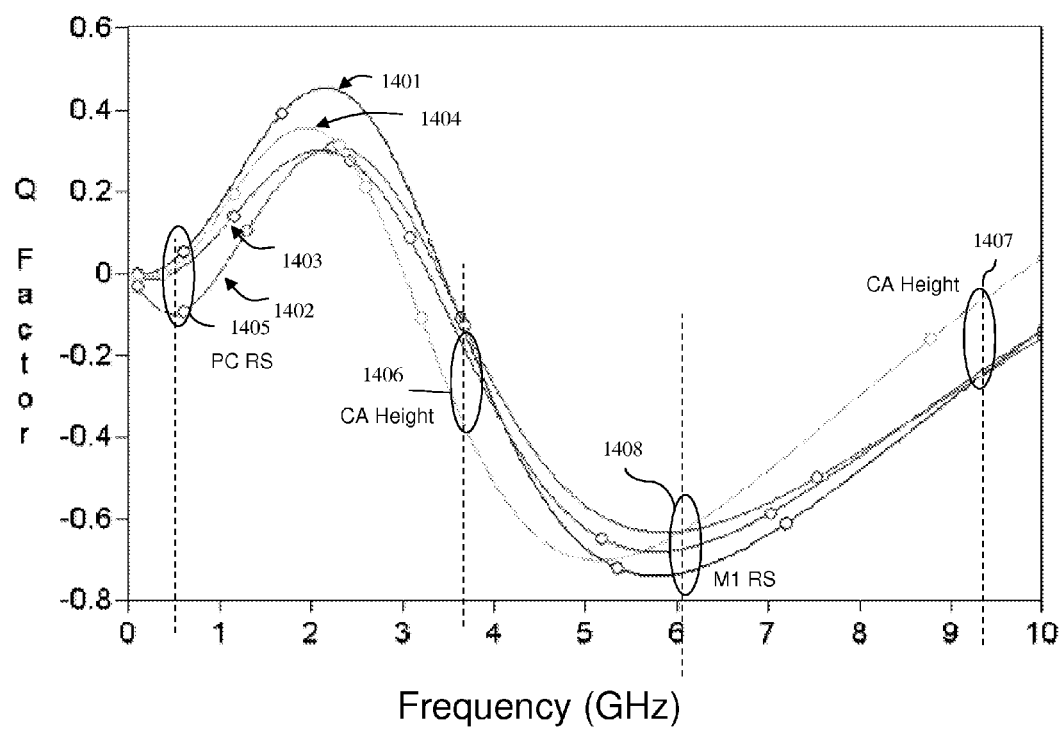
FIG. 14 is a graph illustrating an exemplary comparison between optimal resonant circuit behavior in the absence of process variations and resonant circuit behavior sensitive to independent process variations.

To then determine the values for the target integrated circuit parameters (i.e., to determine a parameter measurement based on the normalized data), the analyzer 1250 can access a database 1252 of simulation results that predict not only circuit 1210 behavior in the absence of process variations and but also in the presence of different process variations. Extraction and simulation demonstrate that the resonator structure 500 provides characteristic response curves in the GHz range, with such response characteristics deterministically variable in accordance to changes in certain targeted parametrics (e.g., contact 540 height, polysilicon sheet resistance in the resistor 520 and metal sheet resistance in the inductor 510). Specifically, there are characteristic frequency ranges dominated by each of the targeted parametric variability. FIG. 14 is a graph illustrating an exemplary comparison between optimal resonant circuit behavior in the absence of process variations and resonant circuit behavior sensitive to independent process variations. Specifically, curve 1401 illustrates resonator circuit behavior in the absence of process variations. Curves 1402-1404 illustrate resonator circuit behavior sensitivity to different independent process variations (e.g., where polysilicon conductivity is decreased by 30% in curve 1402, metal conductivity is decreased by 30% in curve 1403 and contact height is decreased by 30% in curve 1404. In this example, individual parametric variations can be calculated from one Q factor curve with polysilicon sheet resistance at low frequencies (see reference number 1405), with contact height at mid frequencies (see reference number 1406) or very high frequencies (see reference number 1407) and with metal sheet resistance at moderately high frequencies (see reference number 1408).

The output 1255 of the analyzer 1250 (i.e., the intra-process integrated circuit parameter measurements) can then be used to provide immediate control for parametric centering through in-process correction, for end point detection, for feedback corrections to prior process steps and/or for feedforward corrections to subsequent process steps.

As described in detail above, it is anticipated that the system embodiments of the present invention including system 1200 will ideally comprise one or more additional passive resonators to be interrogated by the same interrogation unit 1240 or by different interrogation units at the same time in order to more accurately determine the values for the integrated circuit parameters. These additional passive resonators can, for example, comprise resonators, such as those described above and illustrated in FIGS. 9-11, with different sensitivities to the integrated circuit parameters.

Figure 15:
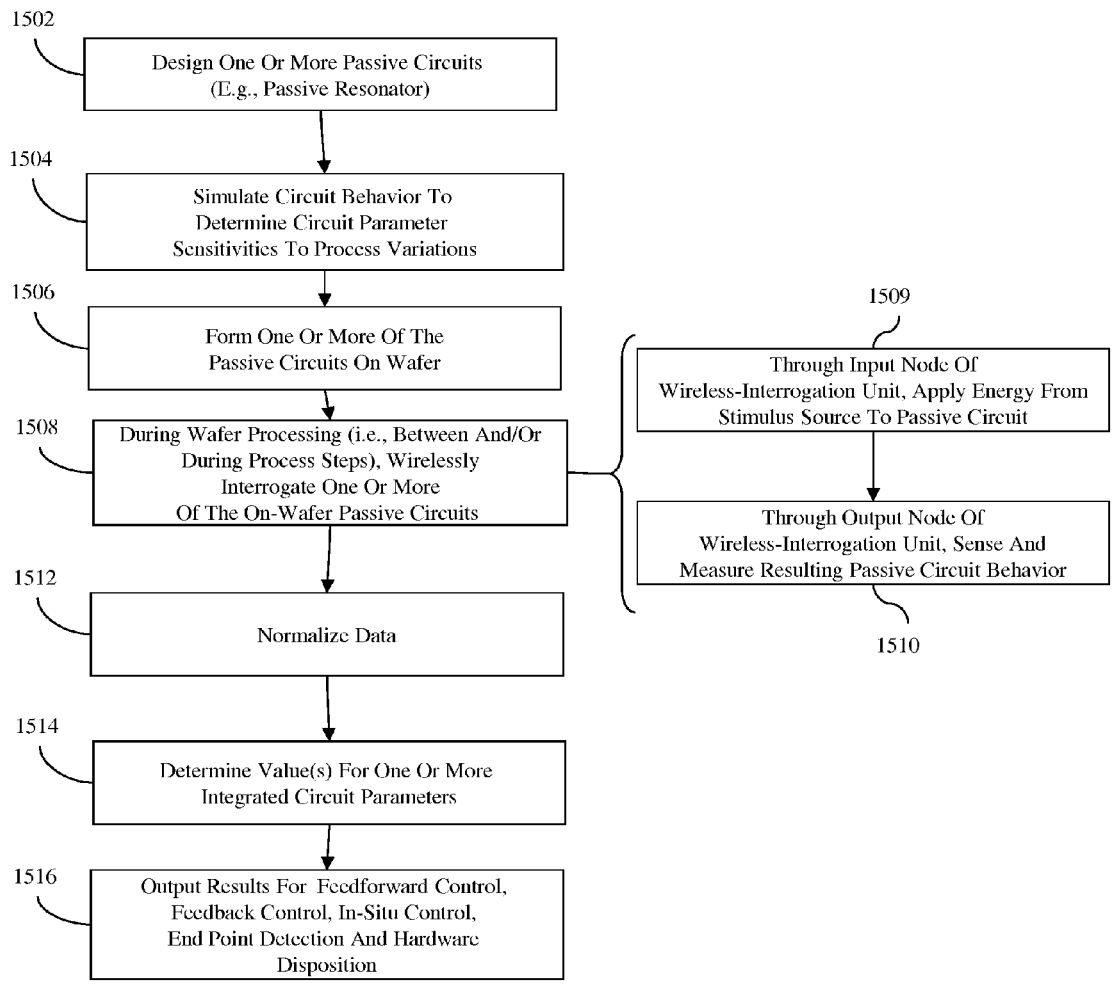
FIG. 15 is a flow diagram illustrating a method of the invention.

Referring to FIG. 15, also disclosed are embodiments of an associated method for wireless measurement of integrated circuit parameters. The method embodiments comprise designing a passive circuit that exhibits, in response to a given stimulus, a give type of behavior capable of being wirelessly detected and that further has a predetermined sensitivity to process variations in one or more integrated circuit parameters (e.g., one or more physical or electrical integrated circuit parameters) (1502). For example, the passive circuit can be designed as a passive resonator 500, as described above and illustrated in FIG. 5, that exhibits resonant behavior in response to radio frequency energy (e.g., a radio frequency pulse or sine voltage) and that has a predetermined sensitivity to process variations in one or more integrated circuit parameters (e.g., polysilicon sheet resistance, metal sheet resistance or contact height). Following design, the passive circuit is simulated and, more specifically, the simulations are performed to predict not only circuit behavior in the absence of process variations and but also in the presence of different process variations (i.e., to determine sensitivities to process variations) (1504). Then, the passive circuit is formed on a wafer (1506).

During wafer processing (i.e., between and/or during process steps), this passive circuit can be wirelessly interrogated to determine the actual behavior exhibited by the passive circuit in response to an applied stimulus (1508). That is, a stimulus (e.g., radio frequency energy in the form of a pulse or sine voltage) is applied to the passive circuit from a stimulus source (e.g., a pulse generator or sine sweep generator) through the input node of an interrogation unit (e.g., a wire coil) (1509). The resulting circuit behavior is then sensed and measured by a sensor (e.g., a spectrum analyzer) through the output node of the interrogation unit (1510). Then, the actual behavior data (i.e., measured data) is communicated to an analyzer and normalized to account for scaling, offset and/or noise errors in measurements (1512), which can be due to variability in RF probe placement and distance from the passive circuit. A determination can be made as to the value (i.e., a measurement value) of the one or more integrated circuit parameters, based on a difference between the expected behavior (i.e., the optimal circuit behavior in the absence of process variations) and the actual behavior exhibited by the circuit (1514). The results of this determining process (i.e., the integrated circuit parameter measurements) can then be used in feedforward control, feedback control, in-situ control, end point detection and hardware disposition (1516).

As described above, the method embodiments comprise interrogating only one passive circuit on a wafer. However, it is anticipated that the method will ideally comprise designing and simulating multiple passive circuits at processes 1502-1504, forming multiple passive circuits on the wafer at process 1506 and simultaneously multiple passive circuits at process 1508 in order to more accurately determine the values for the integrated circuit parameters.

For example, the wafer can be formed at process 1506 with at least one additional passive circuit with a different predetermined sensitivity to the process variations in the at least one integrated circuit parameter. The additional passive circuit can be wirelessly interrogated at process 1508, e.g., by a different wireless-interrogation unit, to determine the actual behavior exhibited by the additional passive circuit in response to the stimulus. The determining process 1514 can then be more accurate in that it is based, not only on the actual behavior exhibited by the first passive circuit (as detected by the first wireless-interrogation unit), but also on the difference between the expected behavior and the actual behavior exhibited by the additional passive circuit in response to the stimulus (as detected by the additional wireless-interrogation unit).

Alternatively, the wafer can be formed at process 1506 with an additional passive circuit with the same predetermined sensitivity to the process variations in the at least one integrated circuit parameter, but tuned differently than the passive circuit. Then, while the first passive circuit is being interrogated at process 1508, this additional passive circuit can also be interrogated (i.e., essentially simultaneously) by the same wireless-interrogation unit. The determining process 1514 can then be more accurate in that it is based, not only on the actual behavior exhibited by the first passive circuit (as detected by the wireless-interrogation unit), but also on the difference between the expected behavior and the actual behavior exhibited by the additional passive circuit in response to the stimulus (also as detected by the same wireless-interrogation unit). Because multiple passive circuits can be simultaneously interrogated at process 1508, the present inline measuring technique provides higher sampling rates and tighter process controls over prior art inline measuring techniques.

Therefore, disclosed above are embodiments of a system and a method that allow for wireless and dynamic intra-process measurements of integrated circuit parameters. The embodiments incorporate the use of a passive circuit, such as an inductor-capacitor-resistor (LCR) circuit resonator, that has a predetermined sensitivity to process variations in one or more physical or electrical integrated circuit parameters. The passive circuit can be wirelessly interrogated between and/or during process steps. Then, the actual behavior exhibited by the passive circuit in response to the wireless-interrogation is compared to the expected behavior of an optimal circuit in the absence of process variations in order to determine measurement value(s) for the one or more parameters. The measurements taken according to the present invention can be used to provide immediate control for parametric centering through in-process correction, for end point detection, for feedback corrections to prior process steps and/or for feedforward corrections to subsequent process steps. Thus, the present invention allows for better control of desired integrated circuit parameters (i.e. Leff, Weff, etc.) over prior art inline measuring techniques. Additionally, since these measurements are taken wirelessly, the present invention avoids damaging sampled sites. Finally, since sampling can be performed in parallel for multiple sites per die/wafer, the present invention provides higher sampling rates and tighter process controls over prior art inline measuring techniques. Also disclosed is an embodiment of an exemplary passive circuit and, specifically, a passive resonator that can be used to implement the disclosed system and method embodiments.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the embodiments can be practiced with modification within the spirit and scope of the appended claims.

What is claimed is:

1. A system for wireless measurement of integrated circuit parameters, said system comprising:
   a wafer comprising a passive circuit with a predetermined sensitivity to process variations in at least one integrated circuit parameter, said at least one integrated circuit parameter comprises at least one of a physical parameter and an electrical parameter;
   an interrogation unit positioned adjacent to, without contacting, said passive circuit, said interrogation unit wirelessly applying a stimulus to said passive circuit and further wirelessly detecting actual circuit behavior of a specific type exhibited by said passive circuit in response to said stimulus; and
   an analyzer in communication with said interrogation unit and determining a value for said at least one integrated circuit parameter based on a difference between expected circuit behavior to be exhibited by said passive circuit in response to said stimulus and said actual circuit behavior exhibited by said passive circuit in response to said stimulus.

2. The system according to claim 1, further comprising a stimulus source connected to said interrogation unit and generating said stimulus for application to said passive circuit through said interrogation unit.

3. The system according to claim 1, further comprising a sensor in communication with said interrogation unit and said analyzer, said sensor sensing said actual circuit behavior as detected by said interrogation unit, measuring said actual circuit behavior and transmitting a measurement of said actual circuit behavior to said analyzer.

4. The system according to claim 1, said analyzer further determining values for multiple integrated circuit parameters based on said actual circuit behavior.

5. The system according to claim 1, said passive circuit and said interrogation unit being separated by a space comprises one of air and a dielectric material.

6. The system according to claim 1,
   said wafer further comprising an additional passive circuit with a different predetermined sensitivity to said process variations in said at least one integrated circuit parameter as compared to said predetermined sensitivity of said passive circuit, and
   said system further comprising an additional interrogation unit positioned adjacent to, without contacting, said additional passive circuit, said additional interrogation unit wirelessly applying an additional stimulus to said additional passive circuit and further wirelessly detecting additional actual circuit behavior of said specific type exhibited by said additional passive circuit in response to said additional stimulus, said analyzer further determining said value for said at least one integrated circuit parameter based also on a difference between additional expected circuit behavior to be exhibited by said additional passive circuit in response to said stimulus and said additional actual circuit behavior exhibited by said additional passive circuit in response to said stimulus.

7. The system according to claim 1,
said wafer further comprising an additional passive circuit with said predetermined sensitivity to said process variations in said at least one integrated circuit parameter, said interrogation unit further being positioned adjacent to, without contacting, said additional passive circuit, said interrogation unit wirelessly applying said stimulus to said additional passive circuit and further wirelessly detecting additional actual circuit behavior of said specific type exhibited by said additional passive circuit in response to said stimulus,
said additional passive circuit being tuned differently than said passive circuit so that said interrogation unit can simultaneously interrogate said passive circuit and said additional passive circuit and so that said analyzer can further determine said value for said at least one integrated circuit parameter based on a difference between additional expected circuit behavior to be exhibited by said additional passive circuit in response to said stimulus and said additional actual circuit behavior exhibited by said additional passive circuit in response to said stimulus.

8. A passive resonator with a predetermined sensitivity to process variations in at least one integrated circuit parameter, said passive resonator comprising:
a substrate;
at least one structure with resistive behavior on said substrate;
at least one structure with inductive behavior on said substrate; and
at least one structure with capacitive behavior on said substrate, said at least one structure with resistive behavior, said at least one structure with capacitive behavior and said at least one structure with inductive behavior being interconnected and configured to form an inductor-capacitor-resistor (LCR) circuit that exhibits, in response to radio frequency energy, resonant behavior that varies in a predictable manner as a function of said process variations in said at least one integrated circuit parameter, said at least one integrated circuit parameter comprising one of a physical parameter and an electrical parameter.

9. The passive circuit according to claim 8, said inductor-capacitor-resistor (LCR) circuit comprises a three-layer structure comprising:
a metal inductor layer comprising said at least one structure with inductive behavior;
a polysilicon resistor layer aligned below said metal inductor layer and comprising said at least one structure with resistive behavior; and
a dielectric layer between said polysilicon resistor layer and said metal inductor layer such that said polysilicon resistor layer, said dielectric layer and said metal inductor layer, in combination, form said at least one structure with capacitive behavior,
said resonant behavior varying in said predictable manner, due to the physical dimensions and shapes of said metal inductor layer, said dielectric layer and said polysilicon layer.

10. The passive circuit according to claim 9, further comprising a contact extending vertically through said dielectric layer and electrically connecting said polysilicon resistor layer and said metal inductor layer.

11. The passive circuit according to claim 9, said polysilicon resistor layer comprising a first section aligned below a center of said metal inductor layer and a plurality of second sections extending radially from said first section beyond an outer edge of said metal inductor layer.

12. The passive circuit according to claim 9, said metal inductor layer comprising a spiral-shaped metal wire with an inner end electrically connected to said polysilicon resistor layer.

13. The passive circuit according to claim 9, said at least one integrated circuit parameter comprises at least one of polysilicon sheet resistance, contact height and metal sheet resistance.

14. A system for wireless measurement of integrated circuit component parameters, said system comprising:
a wafer comprising a passive resonator with a predetermined sensitivity to process variations in at least one integrated circuit parameter, said at least one integrated circuit parameter comprising at least one of a physical parameter and an electrical parameter;
an interrogation unit positioned adjacent to, without contacting, said passive resonator, said interrogation unit wirelessly applying a stimulus to said passive resonator, said stimulus comprising a radio frequency energy and said interrogation unit further wirelessly detecting actual resonant behavior exhibited by said passive resonator in response to said radio frequency energy; and
an analyzer in communication with said interrogation unit and determining a value for said at least one integrated circuit parameter based on a difference between expected resonant behavior to be exhibited by said passive resonator in response to said radio frequency energy and said actual resonant behavior exhibited by said passive resonator in response to said radio frequency energy.

15. The system according to claim 14, said interrogation unit comprising a wire coil inductively coupled to said passive resonator, said wire coil having an input node receiving said radio frequency energy at one end for application to said passive resonator and further having an output node at an opposite end.

16. The system according to claim 15, said radio frequency energy comprising a radio frequency pulse and said system further comprising:
a pulse generator generating and applying said radio frequency pulse to said input node; and
a spectrum analyzer electrically connected between said output node and said analyzer, said spectrum analyzer sensing, at said output node, said actual resonant behavior as detected by said interrogation unit, measuring said actual resonant behavior in order to generate a frequency spectrum based on said actual resonant behavior, and transmitting said frequency spectrum to said analyzer.

17. The system according to claim 15, said radio frequency energy comprising a sine voltage and said system further comprising:
a sine sweep generator generating and applying said sine voltage to said input node; and
a spectrum analyzer electrically connected between said output node and said analyzer, said spectrum analyzer sensing, at said output node, said actual resonant behavior as detected by said interrogation unit, measuring said actual resonant behavior in order to generate a phase spectrum and an amplitude spectrum based on said actual resonant behavior, and transmitting said phase spectrum and said amplitude spectrum to said analyzer.

18. A method for wireless measurement of integrated circuit parameters, said method comprising:
providing a wafer comprising a passive circuit having a predetermined sensitivity to process variations in at least one integrated circuit parameter, said at least one integrated circuit comprising at least one of a physical parameter and an electrical parameter;
wirelessly interrogating said passive circuit using an interrogation unit positioned adjacent to, without contacting, said passive circuit, said wirelessly interrogating comprising:
wirelessly applying a stimulus to said passive circuit; and
wirelessly detecting actual circuit behavior of a specific type exhibited by said passive circuit in response to said stimulus; and
determining, by an analyzer in communication with said interrogation unit, a value for said at least one integrated circuit parameter based on a difference between expected circuit behavior to be exhibited by said passive circuit in response to said stimulus and said actual circuit behavior exhibited by said passive circuit in response to said stimulus.

19. The method according to claim 18, further comprising, before said providing of said wafer, designing said passive circuit and simulating behavior of said passive circuit in the absence of process variations and in the presence of different processes variations.

20. The method according to claim 18, further comprising, before said determining, normalizing said actual circuit behavior to account for at least one of scaling, offset and noise errors.

* * * * *